United States Patent
Osborne et al.

(10) Patent No.: US 9,143,120 B2
(45) Date of Patent: Sep. 22, 2015

(54) MECHANISMS FOR CLOCK GATING

(75) Inventors: Randy B. Osborne, Beaverton, OR (US); Stanley S. Kulick, Portland, OR (US); Erin Francom, Fort Collins, CO (US); Thomas P. Thomas, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,840

(22) PCT Filed: Dec. 22, 2011

(86) PCT No.: PCT/US2011/066993
§ 371 (c)(1),
(2), (4) Date: Jun. 25, 2013

(87) PCT Pub. No.: WO2013/095551
PCT Pub. Date: Jun. 27, 2013

(65) Prior Publication Data
US 2014/0009195 A1   Jan. 9, 2014

(51) Int. Cl.
G06F 1/04 (2006.01)
H03K 5/15 (2006.01)
G06F 1/06 (2006.01)
G06F 1/10 (2006.01)
G06F 1/32 (2006.01)

(52) U.S. Cl.
CPC .. *H03K 5/15* (2013.01); *G06F 1/06* (2013.01); *G06F 1/10* (2013.01); *G06F 1/32* (2013.01)

(58) Field of Classification Search
None
See application file for complete search history.

(56) References Cited

U.S. PATENT DOCUMENTS

| | | | | |
|---|---|---|---|---|
| 7,284,143 | B2 * | 10/2007 | Song et al. | 713/503 |
| 7,764,095 | B2 * | 7/2010 | Werner et al. | 327/158 |
| 8,593,191 | B1 * | 11/2013 | Cooke | 327/158 |
| 2004/0239388 | A1 | 12/2004 | Lee | |
| 2005/0265506 | A1 | 12/2005 | Foss et al. | |
| 2009/0174441 | A1 * | 7/2009 | Gebara et al. | 327/115 |
| 2009/0230946 | A1 * | 9/2009 | Suda | 324/76.11 |
| 2010/0026351 | A1 * | 2/2010 | Lin | 327/153 |
| 2010/0135268 | A1 * | 6/2010 | Seok | 370/338 |
| 2010/0207694 | A1 | 8/2010 | Miyata et al. | |
| 2012/0306553 | A1 * | 12/2012 | Kim et al. | 327/158 |

FOREIGN PATENT DOCUMENTS

| | | |
|---|---|---|
| TW | I341537 | 5/2011 |
| WO | WO-2011107828 | 9/2011 |

OTHER PUBLICATIONS

International Search Report and Written Opinion for PCT/US2011/066993 mailed Aug. 31, 2012, 10 pages.
International Preliminary Report on Patentability for PCT/US2011/066993 mailed Jul. 3, 2014, 7 pages.
Official Letter and Search Report for Taiwan Patent Application No. 101143933 mailed Nov. 12, 2014, 8 pages.

* cited by examiner

*Primary Examiner* — Cassandra Cox
(74) *Attorney, Agent, or Firm* — Blakely, Sokoloff, Taylor & Zafman LLP

(57) ABSTRACT

Mechanisms for clock gating. A clock generation circuit provides a clock signal over a clock signal distribution network within an integrated circuit package. Gating elements within the clock signal distribution network disable the clock signal to one or more portions of the clock signal distribution network. A digital locked loop (DLL) maintains settings without tracking when the clock signal is disabled.

24 Claims, 6 Drawing Sheets

MECHANISMS FOR CLOCK GATING

TECHNICAL FIELD

Embodiments of the invention relate to techniques for managing distribution of clock signals. More particularly, embodiments of the invention relate to techniques for selectively disabling distribution of a clock signal through an interface within a multi-component package (MCP).

BACKGROUND

Logic circuits generally are not active at all times. One approach to reducing power consumption is to deactivate or slow down or otherwise change the operational state of the logic circuit when not in use to reduce power consumption. Various techniques have been developed to control operational states for power consumption purposes.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Described herein is an On-Package I/O (OPIO) interface that solves the problems of conventional I/O interfaces by providing very high bandwidth I/O between chips in a Multi Chip Package (MCP) with very low power, area and latency. OPIO may be useful, for example, to interconnect a processor to memory (SRAM/DRAM/other memory), another process, a chip set, a graphics processor, or any other chip in a MCP with an order of magnitude lower energy per bit and area per bandwidth efficiencies compared to conventional I/O.

Various embodiments of the interfaces described herein include one or more of the following components: (1) a single-ended, high-speed I/O interface (e.g., CMOS interface) between IC chips in a MCP with a relatively small die-to-die gap; (2) an impedance tuned transmitter (e.g., CMOS transmitter) and receiver with no termination or very weak termination, and no equalization; (3) a forwarded clock signal for a cluster of signals with length-matched routing to minimize or eliminate per pin de-skew; and/or (4) reduced electrostatic discharge (ESD) protection to provide lower pad capacitances and higher data rates.

Close chip assembly in MCP enables very short length matched I/O traces, which in turn enables OPIO architectures described herein to run at high bandwidth using simplified single-ended I/O and clocking circuits to reduce power, area and latency. In one embodiment, high-speed, single-ended I/O with minimum bump pitch reduces bump limited silicon area for required bandwidth.

In one embodiment, use of a CMOS transmitter and receiver with no or weak receiver termination and no equalization can reduce I/O power. Simplified clocking, with a forwarded clock per cluster of signals and no per pin de-skew, can be achieved due to careful length matched routing that reduces clock power. Thus, the OPIO architectures described herein provide high bandwidth between chips at very low power, area and latency. MCP with OPIO provides product, process and die area flexibility without significant power and area overhead. The OPIO architectures described herein can also be extended to close discrete packages with full ESD protection for small form factor mobile applications at lower data rates. Multi-level (e.g., M-PAM) signaling can be used at higher data rates to keep the clock frequency down.

Figure 1:
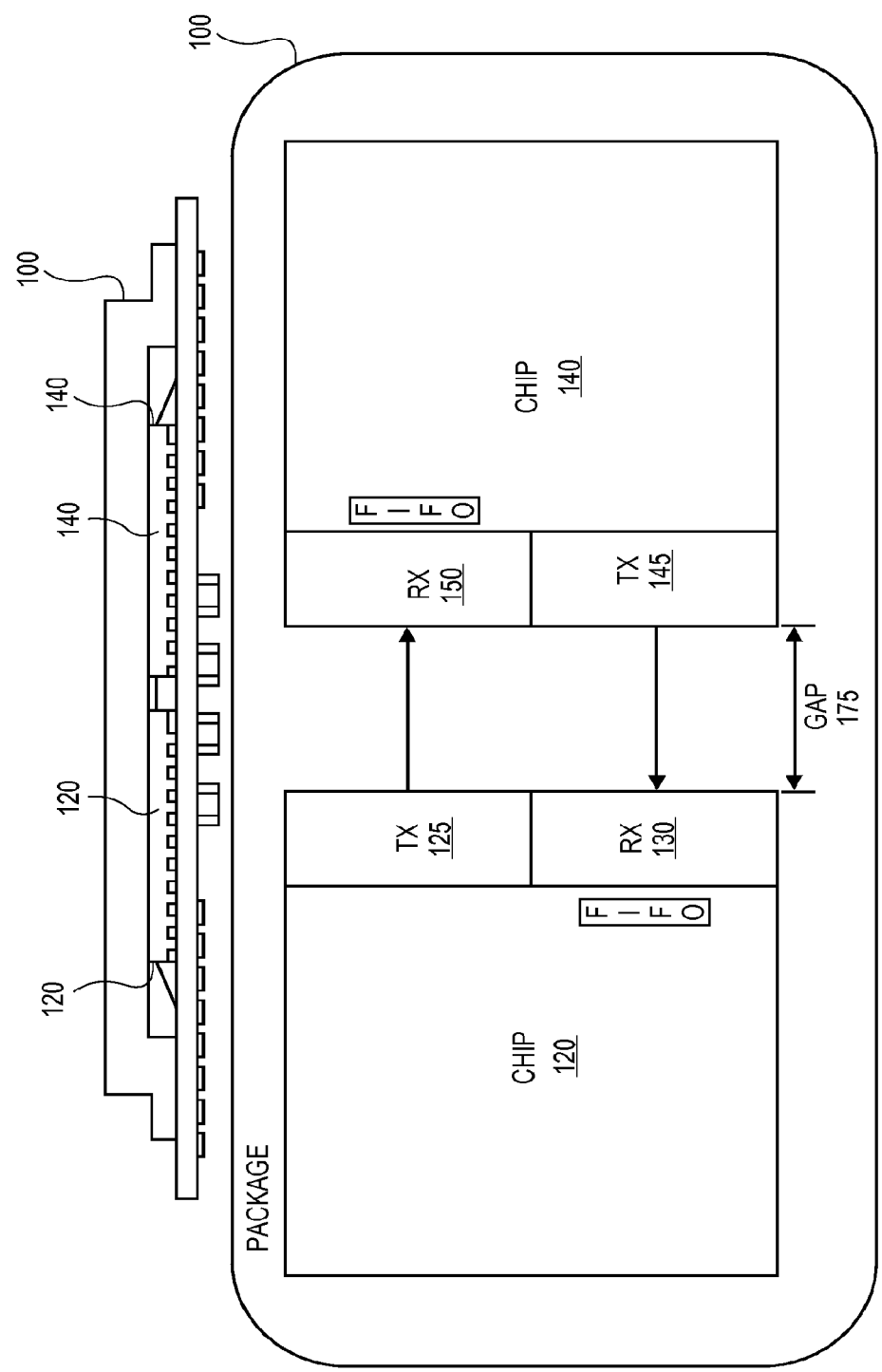
FIG. 1 is a block diagram of one embodiment of a multi-chip package (MCP) having on-package input/output (OPIO) interfaces between at least two chips.

FIG. 1 is a block diagram of one embodiment of a multi-chip package (MCP) having on-package input/output (OPIO) interfaces between at least two chips. The example of FIG. 1 illustrates two chips with interfaces; however, any number of chips within a package can be interconnected using the techniques described herein.

Package 100 may be any type of package that may contain multiple integrated circuit chips. In the example of FIG. 1, package 100 contains chip 120 and chip 140. These chips may be, for example, processors, memory chips, graphics processors, etc.

In one embodiment, chip 120 includes OPIO transmitters 125 and OPIO receivers 130. Similarly, chip 140 includes OPIO transmitters 145 and OPIO receivers 150. Transmitters 125 are coupled with receivers 150 and transmitters 145 are coupled with receivers 130.

In one embodiment, gap 175 between chip 120 and chip 140 is relatively small. In one embodiment, gap 175 is less than 20 mm. In one embodiment, gap 175 is less than 10 mm. In one embodiment, gap 175 is approximately 3 mm. In other embodiments, gap 175 may be less than 3 mm. In general, the smaller gap 175, the greater the bandwidth that may be provided between chips.

In one embodiment, the interfaces between transmitter 125 and receiver 150, and between transmitter 145 and receiver 130 are single-ended, relatively high-speed interfaces. In one embodiment, the interfaces are CMOS interfaces between chip 120 and chip 140. In one embodiment, transmitters 125 and 145 are impedance matched CMOS transmitters and no termination or equalization is provided. In one embodiment, transmitters 125 and 145 are impedance matched CMOS transmitters and very weak termination and no equalization is provided.

In one embodiment, a forwarded clock signal is transmitted with a cluster of signals. In one embodiment, length-matched routing is provided between the transmitters and the receivers. In one embodiment, minimal electrostatic discharge (ESD) protection (as little as 70 Volts) is provided for the interfaces between chips 120 and 140.

In one embodiment, using the techniques described herein power consumption may be reduced when the OPIO bandwidth utilization is low (e.g., 0 to 25% of peak bandwidth). In some embodiments, the power reduction has little or no impact on read latency.

The techniques described herein apply to, for example, a high-bandwidth interface with a clock domain at a requesting agent (e.g., a processor core) separate from a clock domain at a responding agent (e.g., a memory device). In one embodiment, the majority of a transmission global clock signal distribution may be selectively disabled. In one embodiment, only the portion of the distribution network required to keep a phase locked loop (PLL) feedback established is powered. In one embodiment, one or more elements downstream from the PLL (e.g., transmission local distribution, forwarded clocks, receive clock distribution) have clock signals disabled. In one embodiment, the settings of a delay locked loop (DLL) are maintained (frozen) when the clock signal input is disabled and the DLL becomes operational as soon as the clock is enabled.

Various embodiments of the architecture described herein may include one or more of the following elements. Gating elements may be included in the clock signal distribution network to allow for disabling of clock signals to various components. In one embodiment, a gated forwarded clock signal is utilized with a preamble and/or postamble.

One or more DLLs may be frozen (e.g., settings preserved, but not tracking) so that clock centering can be maintained when the forwarded clock is disabled. In one embodiment, there may be periodic disabling of a low power mode to relock the DLLs. Techniques are provided to identify valid clock pulses on the receiving side. In one embodiment, a processor core may provide valid signals to a receiving side of the interface to indicate valid clock signals.

Figure 2:
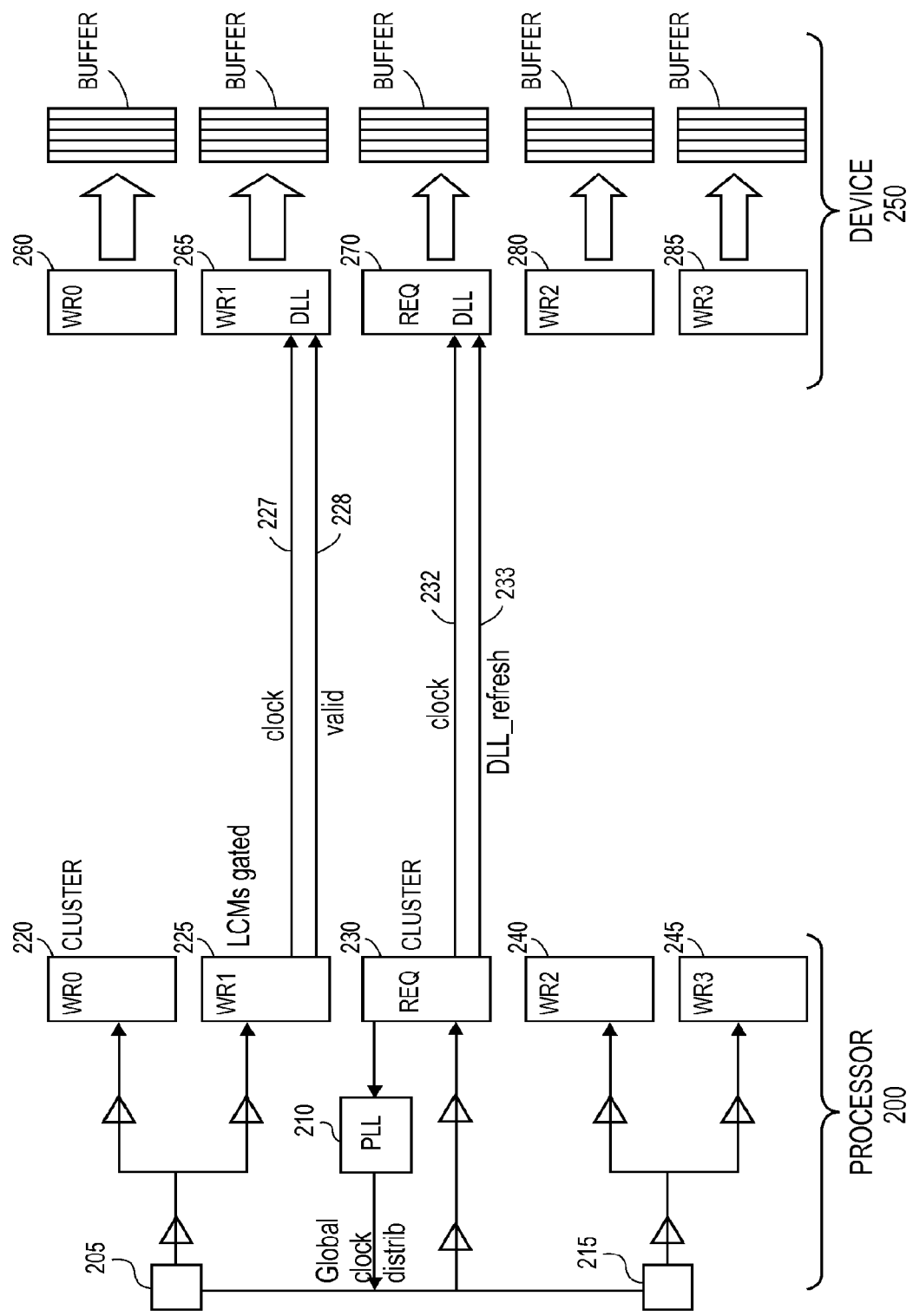
FIG. 2 is a block diagram of one embodiment of an interface having a distributed clock signal that may be selectively disabled.

FIG. 2 is a block diagram of one embodiment of an interface having a distributed clock signal that may be selectively disabled. In the example of FIG. 2, a clock signal and corresponding valid signal are utilized for each cluster of data lines. In one embodiment, the interface may be various configurations of the OPIO interface described above.

In one embodiment, processor 200 operates as a master device and device 250 operates as a slave device. In alternate embodiments, a master-slave configuration is not necessary and other types of devices (e.g., other than a processor, or memory) may also be supported. Processor 200 includes phase locked loop (PLL) 210 that operates to provide a clock signal to processor 200 and device 250. The clock signal may be distributed over a clock distribution network that includes lines within the interface between processor 200 and device 250.

In one embodiment, the interface includes multiple clusters of data (or control) lines, with each cluster having an associated clock signal from PLL 210. In one embodiment, the clock distribution network includes gating circuitry to selectively disable clock signals throughout the clock distribution network. In one embodiment, the clock distribution network is configured to have multiple levels of gating circuitry to selectively disable the clock signal.

Local clock gating refers to gating of a clock signal to functional blocks at leaves of clock distribution tree. In one embodiment, data path transmitters and receivers are disabled, and flops are clock gated except as needed to transfer data. In one embodiment, the link layer uses the Write Data Valid signal from the processor to gate write path clocks and both sides of the interface use timers from the read command to enable clocks.

Global clock distribution refers to the condition in which the network (usually delay balanced to minimize skew between clock edges delivered to different functional blocks at leaves of network) distributes clock signals from its source (e.g., a PLL) to functional blocks. Global clock gating controls the distribution network close to the clock source, but in a way that leaves a minimal subset or "replica" distribution in place to provide a feedback path so the PLL can remain locked.

Powering down a request cluster between commands may not be effective as refreshes may be issued too often. In one embodiment, latency is optimized by keeping the request cluster active at all times. In one embodiment, during local clock gating data path transmitters and receivers are disabled and flops are clock gated except as needed to transfer data. The link layer uses the Write Data Valid signal from the scheduler to gate write path clocks and both sides of the interface use timers from the read command to enable clocks.

Figure 6:
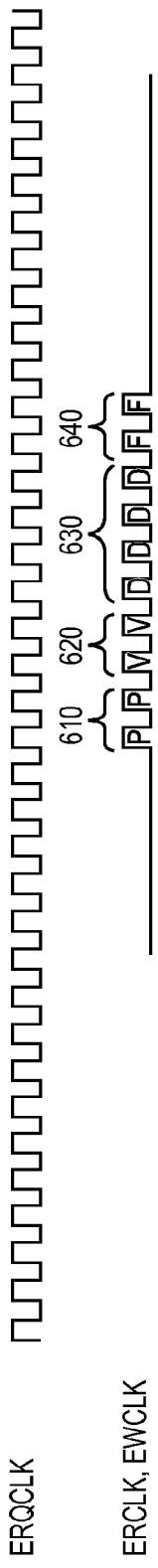
FIG. 6 is an example timing diagram of a data transfer.

In one embodiment, when global clock gating is enabled only those clock pulses that are required to transmit data are enabled. Likewise when forwarded clock gating is enabled without global clock gating, only those forwarded clock pulses that are required to transmit data are enabled. In one embodiment, 10 pulses are required for a cache line of data as shown in FIG. 6, but other configurations may also be supported, e.g. with more data clocks for longer data bursts, fewer preamble or postamble clocks.

Figure 7:
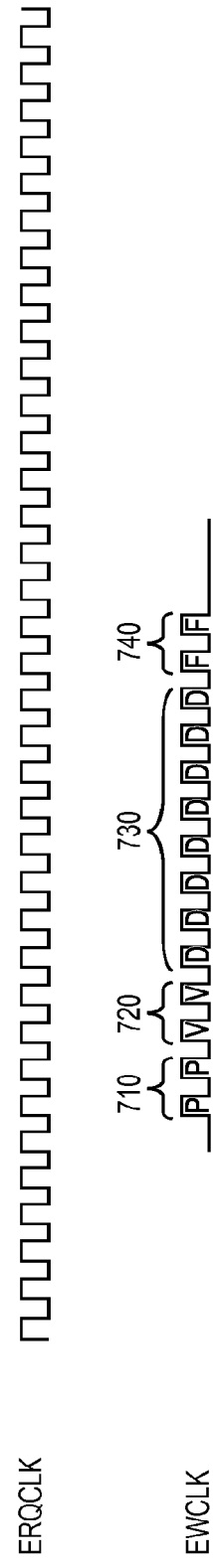
FIG. 7 is an example timing diagram of a data transfer with merged pulses.

Using the 10-pulse example, the first two pulses are a preamble (610) to avoid degradation of the first rising edge after the clock has been low for a relatively long period, two pulses may be used to sample transfers of a valid signal (620) that precedes valid data, four pulses may be used to sample eight transfers of data (630), and two pulses may be used for deserialization and buffer writes (640). This is but one example, other pulse configurations may also be used. FIG. 6 is one example of a timing diagram for this example. In one embodiment, the preamble (710), valid (720) and deserialization/buffer write (740) pulses may be merged for multiple data transfers (730) spaced less than six clock cycles apart. FIG. 7 is one example of a timing diagram for this example with merged pulses for multiple data transfers.

When utilizing forwarded clock gating, clock signals are only sent with data. The DLLs require clock signals periodically to maintain centering even if data is not being sent. To ensure the DLLs track operation conditions, a timer on the processor (or elsewhere) may generate a DLL adjust signal with a configurable interval and period. Although most DLL power is saved by eliminating unnecessary clock pulses, periodic DLL adjustment can be independently enabled to save power associated with the adjustment.

In one embodiment, when the DLL adjust signal is active, forwarded clock signals are sent continuously and no clock gating is applied in the clock path to the DLL. Receive clusters may remain gated as necessary for maximal power savings. In one embodiment, the DLL adjust signal may be active less than 1% of the time. In one embodiment, the DLL adjust signal is sent from the processor to the memory in a request packet. Therefore DLL adjustment can be suspended after a synchronization step when valid request packets can be decoded. In one embodiment, before the synchronization step, the clock signals are continuously generated. In one embodiment, read, write and refresh traffic continues through DLL adjustment and only forwarded clock gating is affected.

Referring back to FIG. 2, global clock gating gates 205 and 215 which causes the downstream portions of the clock distribution network to be gated, which gates all clocks to the OPIO transmitter, forwarded clocks across the OPIO interface, and all clocks at the OPIO receiver.

In one embodiment, a higher level of clock signal gating can be used to disable the clock signal to a larger portion of processor 200 and/or device 250. This can be considered a coarser control of the clock signal. A lower level of clock signal gating can be used to disable the clock signal to smaller portions of processor 200 and/or device 250. The example of FIG. 2 provides two levels of clock gating; however, any number of levels of clock gating may be supported.

In one embodiment, processor 200 includes one or more clusters for data transmission (e.g., 220, 225, 240, 245) and a control cluster (e.g., 230). In one embodiment each cluster includes a line to carry a forwarded clock signal (e.g., clock signal line 227 for transmitter 225). In one embodiment, each cluster also includes a line to carry a valid signal corresponding to the forwarded clock signal. In some embodiments, there is no line for the valid signal or it is time multiplexed with data, control, or other information. Device 250 includes corresponding receiver circuits for data clusters (e.g., 260, 265, 280, 285) and for the control cluster (e.g., 270).

Clocking gating circuits 205 and 215 may be utilized to disable global clock signals to one or more clusters, each which has some number of transmitter circuits. In the example of FIG. 2, clock gating circuit 205 operates to disable the global clock signal to clusters 220 and 225, and clock gating circuit 215 operates to disable the clock signal to clusters 240 and 245. In one embodiment, each cluster may further include clock gating circuitry to disable the local clock signal for the corresponding segment of the clock distribution network.

In one embodiment, logic within processor 200 may be able to determine when data will, or should, flow over the interface. This information may be utilized to selectively disable all or portions of the clock distribution network when not in use to reduce power consumption. This information may also be utilized to control a valid signal on valid line 228. In one embodiment, this information is obtained from the protocol level of operation in processor 200.

In one embodiment, the clock signal to REQ cluster 230 is not disabled. The clock signal 232 in REQ cluster 230 and/or DLL refresh signal 233 may be used to drive a DLL in REQ cluster 270. The DLL may be used to track the clock signal from PLL 210. By not disabling the clock to the REQ cluster during low power operation, the time required for exit from the low power mode will be decreased because less training and/or tracking is necessary to align the first processor request and device clock (e.g. with a clock crossing FIFO) to exit low power mode.

For example, when clock gating circuit 205 disables the downstream clock signal, transmitters 220 and 225 no longer receive the clock signal. Similarly, because the clock signal is forwarded, receivers 260 and 265 also do not receive the clock signal. Clock gating circuit 215 operates in a similar manner for transmitters 240 and 245, and for receivers 280 and 285. This is one example of a coarser grain, or higher level, clock gating.

In one embodiment, each cluster also includes local clock gating circuitry to disable the data signals that may be forwarded to the corresponding receiver and/or disable clocks to functions in the cluster that are not associated with the forwarded clock. In another embodiment, the forwarded clock signal may be disabled on a cluster-by-cluster basis. These are examples of finer grain, or lower level, clock gating.

Figure 3:
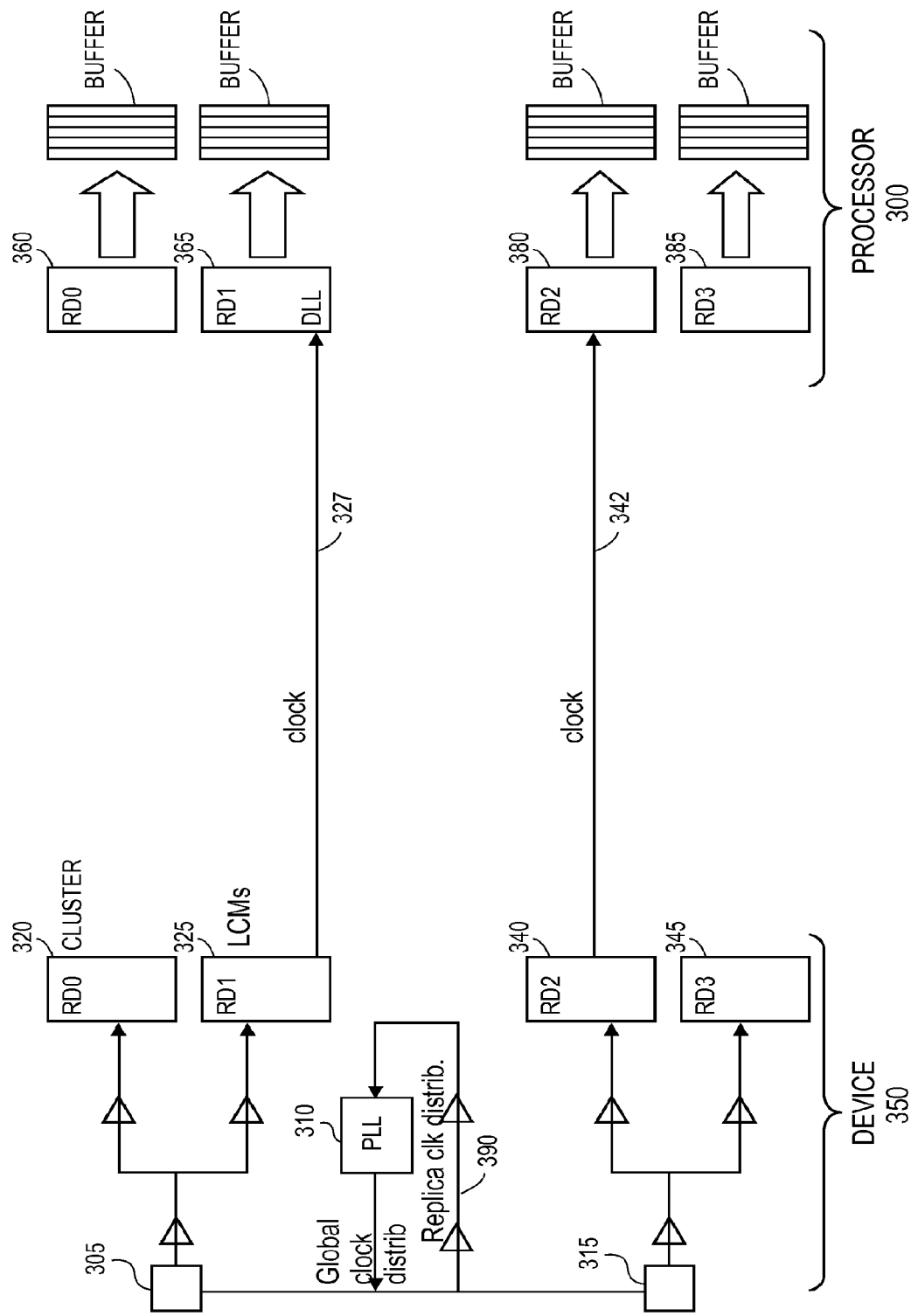
FIG. 3 is a block diagram of one embodiment of an interface having a distributed clock signal that may be selectively disabled.

FIG. 3 is a block diagram of one embodiment of an interface having a distributed clock signal that may be selectively disabled. In the example of FIG. 3, a replica clock distribution element may be utilized to provide feedback to the PLL. Such a replica clock distribution enables the PLL to remain clocked with a feedback loop closely approximating the actual global clock distribution, thus enabling the global distribution minus the replica to be gated off to save power. Keeping the PLL locked avoids lengthy delays (e.g. 1-2 us) to lock PLLs before the global clock is usable—such delays have unacceptable impact on performance. In one embodiment, the interface may be various configurations of the OPIO interface described above.

In one embodiment, processor 300 operates as a master device and device 350 operates as a slave device. In alternate embodiments, a master-slave configuration is not necessary and other types of devices (e.g., other than a processor, or memory) may also be supported. Device 350 includes phase locked loop (PLL) 310 that operates to provide a clock signal to device 350 and a forward clock to processor 300. The clock signal may be distributed over a clock distribution network that includes lines within the interface between device 350 and processor 300.

In one embodiment, the interface includes multiple clusters of data (or control) lines, with each cluster having an associated clock signal from PLL 310. In one embodiment, the clock distribution network includes gating circuitry to selectively disable clock signals throughout the clock distribution network. In one embodiment, the clock distribution network is configured to have multiple levels of gating circuitry to selectively disable the clock signal.

In one embodiment, a higher level of clock signal gating can be used to disable the clock signal to a larger portion of processor 300 and/or device 350. A lower level of clock signal gating can be used to disable the clock signal to smaller portions of processor 300 and/or device 350. The example of FIG. 3 provides two levels of clock gating; however, any number of levels of clock gating may be supported.

In one embodiment, device 350 includes one or more clusters for data transmission (e.g., 320, 325, 340, 345). In one embodiment each cluster includes a line to carry a forwarded clock signal (e.g., clock signal line 327 for transmitter 325 and clock signal line 342 for transmitter 340). Processor 300 includes corresponding receiver circuits for data clusters (e.g., 360, 365, 380, 385).

Clocking gating circuits 305 and 315 may be utilized to disable clock signals to one or more transmitter circuits. In the example of FIG. 3, clock gating circuit 305 operates to disable the clock signal to clusters 320 and 325, and clock gating circuit 315 operates to disable the clock signal to clusters 340 and 345. In one embodiment, each cluster may further include clock gating circuitry to disable the clock signal for the corresponding segment. As discussed above, both global and local clock gating may be supported. In contrast, current techniques are for clocking at the edge of a clock network, which limits degree of power savings. The techniques described herein therefore provide a more efficient and effective clock gating architecture.

In one embodiment, logic within device 350 may be able to determine when data will, or should, flow over the interface. This information may be utilized to selectively disable all or portions of the clock distribution network when not in use to reduce power consumption. In one embodiment, this information is obtained from at least the protocol level of operation in device 350.

The embodiment of FIG. 3 includes replica clock distribution circuit 390 that operates to provide feedback to PLL 310 in a way to mimic distribution of the clock signal through a fully enabled clock distribution network. In one embodiment, one or more delay elements receive the clock signal from PLL 310 and provide a delayed clock signal to PLL 310 where the delay is equal to a round-trip delay of the clock signal through the clock distribution network when enabled.

In one embodiment, processor 300 includes a DLL that is operated in the same manner as the DLL in the example of FIG. 2. In the example of FIG. 3, DLL receives the clock signal from cluster 325. In some embodiments, multiple DLLs may be supported.

Figure 4:
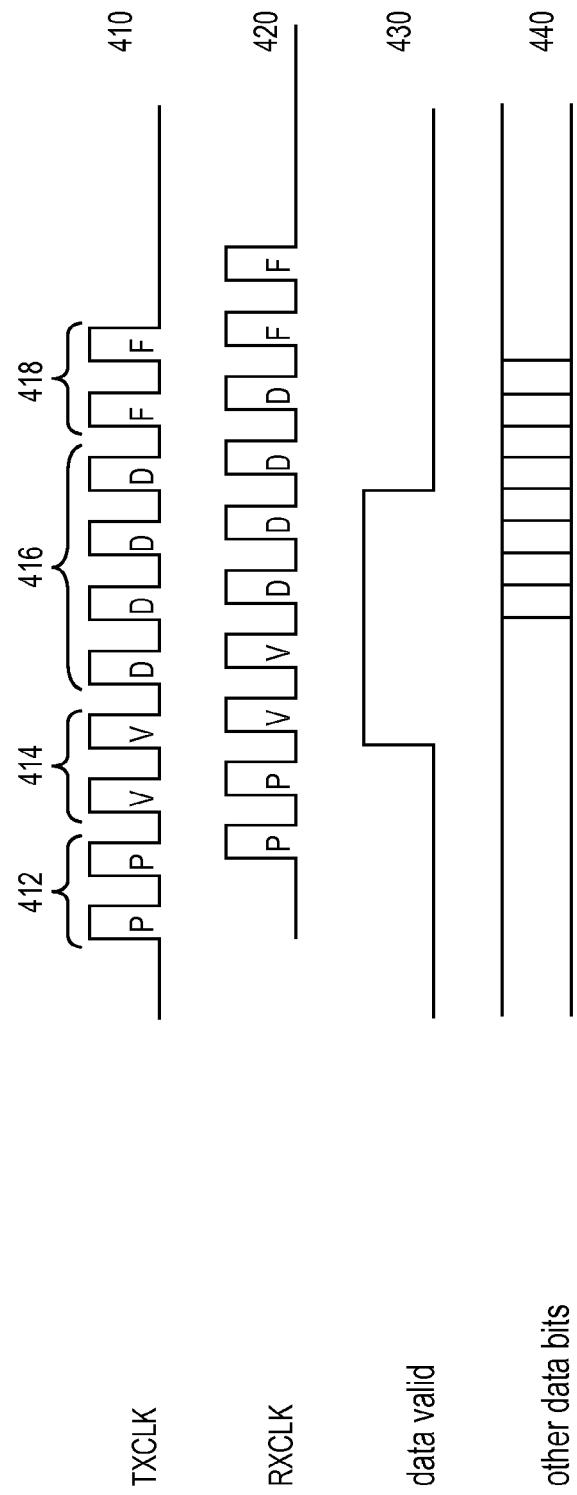
FIG. 4 is an example timing diagram for an embodiment that utilizes a valid clock signal.

FIG. 4 is an example timing diagram for an embodiment that utilizes a valid clock signal. Transmit clock signal (TX-CLK) 410 provides an example clock signal that may be transmitted from a transmitter circuit (e.g., 320 in FIG. 3) to a receiver circuit (e.g., 360 in FIG. 3). In one embodiment, transmit clock signal includes clock cycles corresponding to a preamble 412, valid signal 414, data 416 and post-receiver operation 418. Any number of clock cycles may be utilized for any of these phases.

Centered receive clock signal (RXCLK) 420 is the clock signal utilized by the receiving device (e.g., device 250 in FIG. 2) and may be centered utilizing a DLL as described above. Data valid signal 430 indicates a period of time for which transmitted data is valid. Other data bits 440 indicate other data that may be transmitted across the interface described herein.

Figure 5:
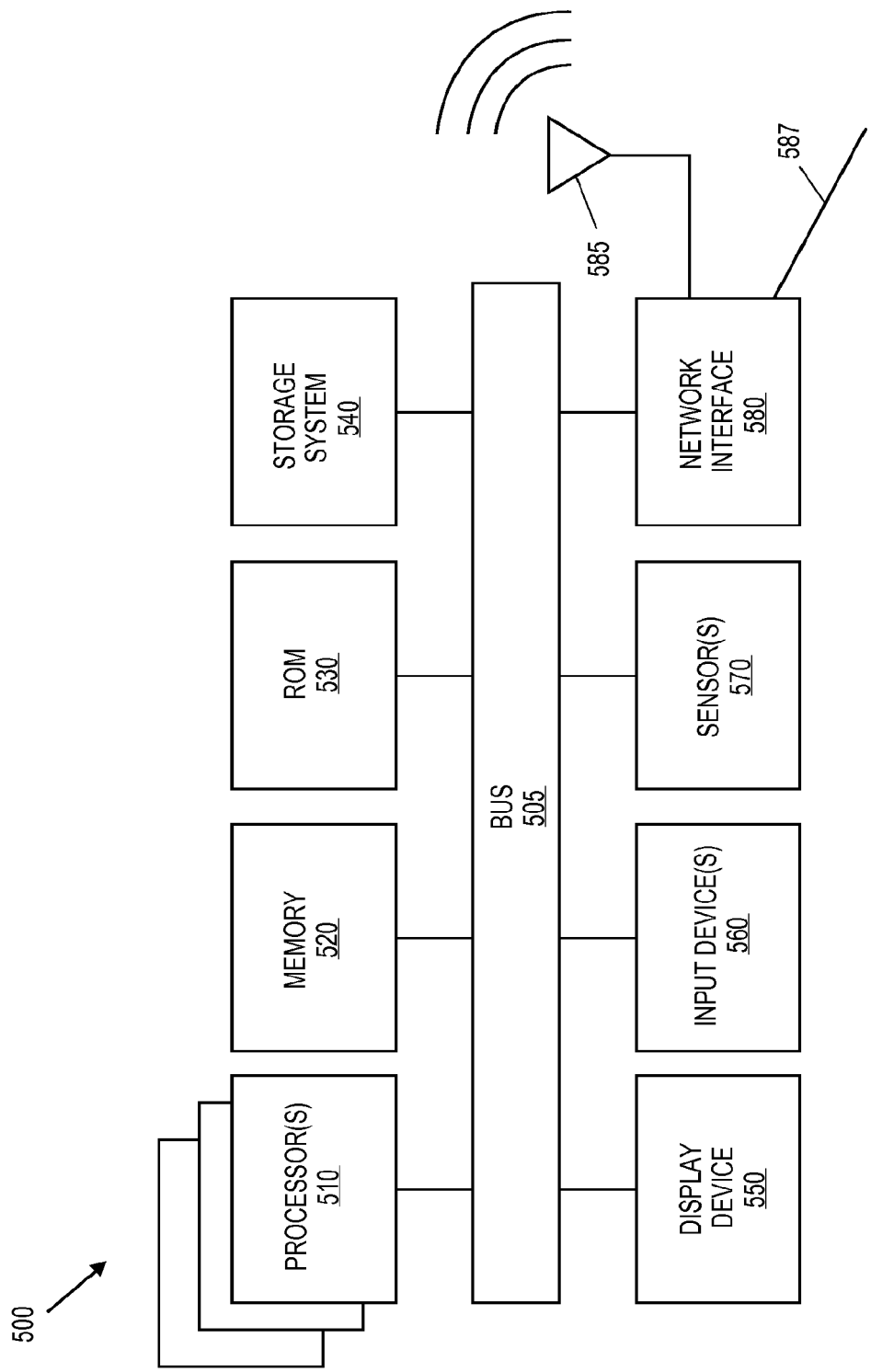
FIG. 5 is a block diagram of one embodiment of an electronic system.

FIG. 5 is a block diagram of one embodiment of an electronic system. The electronic system illustrated in FIG. 5 is intended to represent a range of electronic systems (either wired or wireless) including, for example, a tablet device, a smartphone, a desktop computer system, a laptop computer system, etc. Alternative electronic systems may include more, fewer and/or different components.

One or more of the components illustrated in FIG. 5 may be interconnected utilizing the OPIO architectures described herein. For example, multiple processor chips may be interconnected, or a processor and a cache memory or dynamic random access memory, etc.

Electronic system 500 includes bus 505 or other communication device to communicate information, and processor(s) 510 coupled to bus 505 that may process information. Electronic system 500 may include multiple processors and/or co-processors. Electronic system 500 further may include random access memory (RAM) or other dynamic storage device 520 (referred to as memory), coupled to bus 505 and may store information and instructions that may be executed by processor 510. Memory 520 may also be used to store temporary variables or other intermediate information during execution of instructions by processor(s) 510.

Electronic system 500 may also include read only memory (ROM) and/or other static storage device 530 coupled to bus 505 that may store static information and instructions for processor 510. Data storage device 540 may be coupled to bus 505 to store information and instructions. Data storage device 540 such as a magnetic disk or optical disc and corresponding drive may be coupled to electronic system 500.

Electronic system 500 may also be coupled via bus 505 to display device 550, which can be any type of display device, to display information to a user, for example, a touch screen. Input device 560 may be any type of interface and/or device to allow a user to provide input to electronic system 500. Input device may include hard buttons and/or soft buttons, voice or speaker input, to communicate information and command selections to processor(s) 510.

Electronic system 500 may further include sensors 570 that may be used to support functionality provided by Electronic system 500. Sensors 570 may include, for example, a gyroscope, a proximity sensor, a light sensor, etc. Any number of sensors and sensor types may be supported.

Electronic system 500 further may include network interface(s) 580 to provide access to a network, such as a local area network. Network interface(s) 580 may include, for example, a wireless network interface having antenna 585, which may represent one or more antenna(e). Network interface(s) 580 may also include, for example, a wired network interface to communicate with remote devices via network cable 587, which may be, for example, an Ethernet cable, a coaxial cable, a fiber optic cable, a serial cable, or a parallel cable.

In one embodiment, network interface(s) 580 may provide access to a local area network, for example, by conforming to IEEE 802.11b and/or IEEE 802.11g and/or IEEE 802.11n standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 580 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a clock generation circuit to provide a clock signal over a clock signal distribution network;
   a plurality of gating elements within the clock signal distribution network, the gating elements to disable the clock signal to one or more portions of the clock signal distribution network;
   a digital locked loop (DLL) to maintain settings without tracking when the clock signal is disabled by periodically receiving the clock signal, wherein the period corresponding to the DLL periodically receiving the clock signal is configurable.

2. The apparatus of claim 1 wherein the clock signal distribution network is housed within an integrated circuit package.

3. The apparatus of claim 1 wherein the gating elements provide a global level of clock gating.

4. The apparatus of claim 1 wherein the gating elements allow clock signals for data transfers and gate the clock signals otherwise.

5. The apparatus of claim 4 wherein the clock signals for the data transfers comprise preamble clock pulses, valid data clock pulses, and postamble clock pulses.

6. The apparatus of claim 1 wherein the clock generation circuit comprises a phase locked loop (PLL).

7. The apparatus of claim 1 wherein the clock signal distribution network comprises at least an interface connection to carry the clock signal, further wherein the interface connection is a part of an interface between a first die and a second die, comprising:
   a first set of single-ended transmission circuits on the first die;
   a first set of single-ended receiver circuits on the second die, wherein the receiver circuits have no termination and no equalization; and
   a plurality of conductive lines between the first set of transmission circuits and the first set of receiver circuits, wherein the lengths of the plurality of conductive lines are matched.

8. The apparatus of claim 7 wherein the plurality of gating elements comprise:
   a first level of gating elements coupled to disable to the clock signal to the first set of single-ended transmission circuits; and
   a second level of gating elements coupled to disable the clock signal to one or more lines with in a cluster of lines received by the first set of single-ended receiver circuits.

9. The apparatus of claim 8 further comprising sub-gating elements within one or more of the receiver circuits to generate a selected number of clock pulses to write and increment a receive buffer.

10. The apparatus of claim 8 further comprising sub-gating elements within one or more of the receiver circuits to generate a selected number of clock pulses prior to clock pulses corresponding to valid data.

11. The apparatus of claim 8 wherein the first die, the second die and the plurality of conductive lines are all disposed within a single integrated circuit package.

12. A tablet computing device comprising:
   a clock generation circuit to provide a clock signal over a clock signal distribution network within an integrated circuit package;
   a plurality of gating elements within the clock signal distribution network, the gating elements to disable the clock signal to one or more portions of the clock signal distribution network;
   a processor core coupled to the clock signal distribution network to receive the clock signal;
   a touch screen interface coupled with a processor core; and
   a digital locked loop (DLL) to maintain settings without tracking when the clock signal is disabled by periodically receiving the clock signal, wherein the period corresponding to the DLL periodically receiving the clock signal is configurable.

13. The tablet of claim 12 wherein the clock generation circuit comprises a phase locked loop (PLL).

14. The tablet of claim 12 wherein the clock signal distribution network comprises at least an interface connection to carry the clock signal, further wherein the interface connection is a part of an interface between a first die and a second die, comprising:
   a first set of single-ended transmission circuits on the first die;
   a first set of single-ended receiver circuits on the second die, wherein the receiver circuits have no termination and no equalization; and
   a plurality of conductive lines between the first set of transmission circuits and the first set of receiver circuits, wherein the lengths of the plurality of conductive lines are matched.

15. The tablet of claim 14 wherein the plurality of gating elements comprise:
   a first level of gating elements coupled to disable to the clock signal to the first set of single-ended transmission circuits; and
   a second level of gating elements coupled to disable the clock signal to one or more lines with in a cluster of lines received by the first set of single-ended receiver circuits.

16. The tablet of claim 15 further comprising subgating elements within one or more of the receiver circuits to generate a selected number of clock pulses to write and increment a receive buffer.

17. The tablet of claim 16 wherein the first die, the second die and the plurality of conductive lines are all disposed within a single integrated circuit package.

18. A system comprising:
   a clock generation circuit to provide a clock signal over a clock signal distribution network within an integrated circuit package;
   a plurality of gating elements within the clock signal distribution network, the gating elements to disable the clock signal to one or more portions of the clock signal distribution network;
   a processor core coupled to the clock signal distribution network to receive the clock signal;
   an omidirectional antenna coupled with a processor core; and
   a digital locked loop (DLL) to maintain settings without tracking when the clock signal is disabled by periodically receiving the clock signal, wherein the period corresponding to the DLL periodically receiving the clock signal is configurable.

19. The system of claim 18 wherein the clock generation circuit comprises a phase locked loop (PLL).

20. The system of claim 18 wherein the clock signal distribution network comprises at least an interface connection to carry the clock signal, further wherein the interface connection is a part of an interface between a first die and a second die, comprising:
   a first set of single-ended transmission circuits on the first die;
   a first set of single-ended receiver circuits on the second die, wherein the receiver circuits have no termination and no equalization; and
   a plurality of conductive lines between the first set of transmission circuits and the first set of receiver circuits, wherein the lengths of the plurality of conductive lines are matched.

21. The system of claim 20 wherein the plurality of gating elements comprise:
   a first level of gating elements coupled to disable to the clock signal to the first set of single-ended transmission circuits; and
   a second level of gating elements coupled to disable the clock signal to one or more lines with in a cluster of lines received by the first set of single-ended receiver circuits.

22. The system of claim 21 further comprising sub-gating elements within one or more of the receiver circuits to generate a selected number of clock pulses to write and increment a receive buffer.

23. The system of claim 20 wherein the first die, the second die and the plurality of conductive lines are all disposed within a single integrated circuit package.

24. The system of claim 20 further comprising a replica loop coupled between an output of the clock generation circuit and an input of the clock generation circuit, the replica loop to provide a clock feedback signal to the clock generation circuit when one or more portions of the clock signal distribution network are disabled.

* * * * *